United States Patent [19]

Peck et al.

[11] Patent Number: 5,530,222

[45] Date of Patent: Jun. 25, 1996

[54] APPARATUS FOR POSITIONING A FURNACE MODULE IN A HORIZONTAL DIFFUSION FURNACE

[75] Inventors: Kevin B. Peck, Soulsbyville; Ronald E. Erickson, Jamestown; Stephen H. Matthews, Sonora, all of Calif.

[73] Assignee: Thermtec, Inc., Sonora, Calif.

[21] Appl. No.: 230,786

[22] Filed: Apr. 21, 1994

Related U.S. Application Data

[62] Division of Ser. No. 898,552, Jun. 15, 1992.

[51] Int. Cl.$^6$ ..................................................... F27D 11/00
[52] U.S. Cl. .......................... 219/390; 219/385; 219/403; 432/36
[58] Field of Search ........................ 219/390, 385, 219/395, 391, 399, 400, 402, 403; 392/407, 408, 416, 417, 418; 373/109, 135, 136, 111, 106; 432/11, 152, 36, 239

[56] References Cited

U.S. PATENT DOCUMENTS

| | | | |
|---|---|---|---|
| 3,098,763 | 7/1963 | Deal et al. | 118/49.5 |
| 3,170,016 | 2/1965 | Grace | 266/34 |
| 3,170,977 | 2/1965 | Obenchain | 266/34 |
| 3,385,921 | 5/1968 | Hampton | 13/24 |
| 3,488,044 | 1/1970 | Shepherd | 266/34 |
| 3,811,825 | 5/1974 | Enderlein | 432/122 |
| 3,829,982 | 8/1974 | Pray et al. | 34/4 |
| 4,246,434 | 1/1981 | Gunther et al. | 13/20 |
| 4,412,812 | 11/1983 | Sadowski et al. | 432/11 |
| 4,423,516 | 12/1983 | Mellen, Sr. | 373/111 |
| 4,468,195 | 8/1984 | Sasaki et al. | 432/36 |
| 4,526,534 | 7/1985 | Wollmann | 432/11 |
| 4,543,059 | 9/1985 | Whang et al. | 432/11 |
| 4,545,327 | 10/1985 | Campbell et al. | 118/719 |
| 4,550,245 | 10/1985 | Arai et al. | 219/405 |
| 4,692,115 | 9/1987 | Aldridge et al. | 432/242 |
| 4,694,894 | 9/1987 | Kito et al. | 165/135 |
| 4,702,694 | 10/1987 | Johnson et al. | 432/133 |
| 4,745,088 | 5/1988 | Inoue et al. | 437/102 |
| 4,747,368 | 5/1988 | Brien et al. | 118/715 |
| 4,756,091 | 7/1988 | Van Denend | 34/4 |
| 4,802,441 | 2/1989 | Waugh | 118/666 |
| 4,911,638 | 3/1990 | Bayne et al. | 432/152 |
| 4,937,434 | 6/1990 | Nakao | 219/390 |
| 4,976,612 | 12/1990 | Adams | 432/239 |
| 4,979,464 | 12/1990 | Kunze-Concewitz et al. | 118/719 |
| 5,080,039 | 1/1992 | Kanegae et al. | 118/725 |
| 5,097,890 | 3/1992 | Nakao | 165/39 |
| 5,155,336 | 10/1992 | Gronet et al. | 219/411 |
| 5,174,045 | 12/1992 | Thompson et al. | 34/58 |
| 5,178,534 | 1/1993 | Bayne et al. | 432/152 |
| 5,259,881 | 11/1993 | Edwards et al. | 118/719 |

*Primary Examiner*—Tu Hoang
*Attorney, Agent, or Firm*—Fliesler, Dubb, Meyer & Lovejoy

[57] ABSTRACT

Performance of a high temperature diffusion furnace is enhanced by an improved multi-furnace module design. The furnace is constructed of materials suitable for clean room environments with an adjustable leveling frame assembly. A slide out assembly and heating element alignment mechanism of individual furnace tube modules with a heating element hoist mechanism allows for enhanced maintainability. Heat treatment performance is improved by a sealed heating element with individual furnace module cooling system. Improved thermocouple positioning and composition has also enhanced heat treatment process control and heating element maintainability.

19 Claims, 13 Drawing Sheets

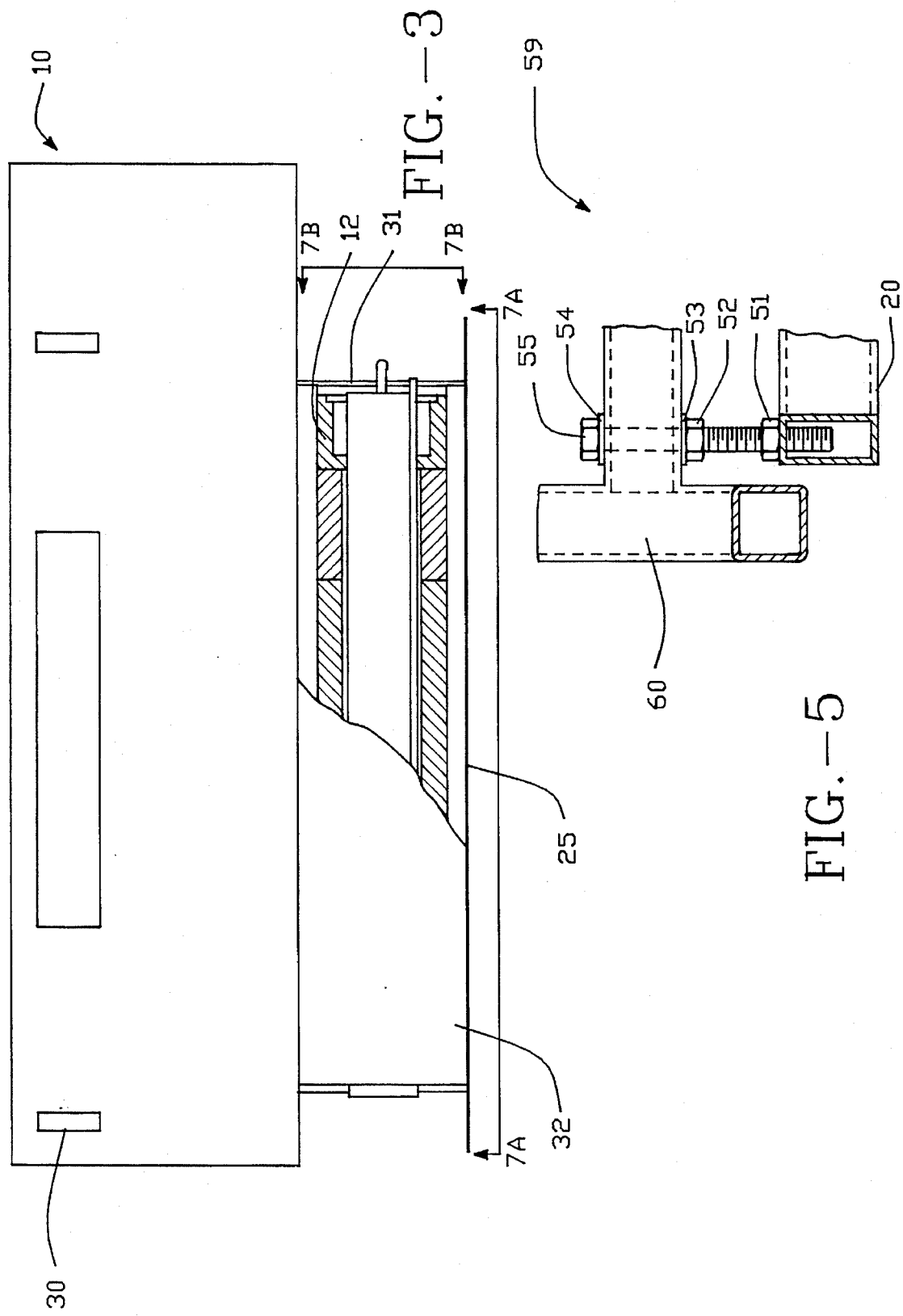

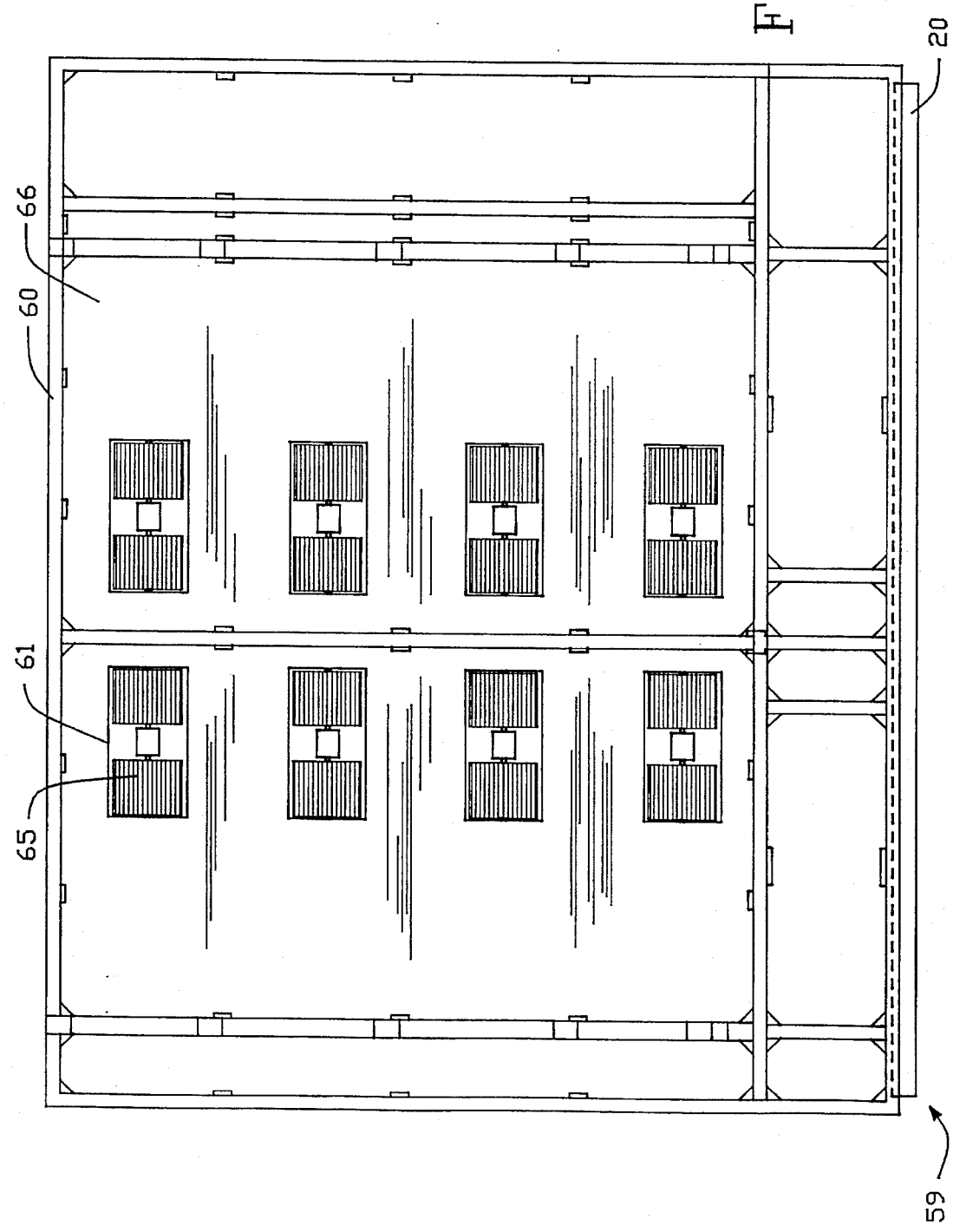
FIG.—6A

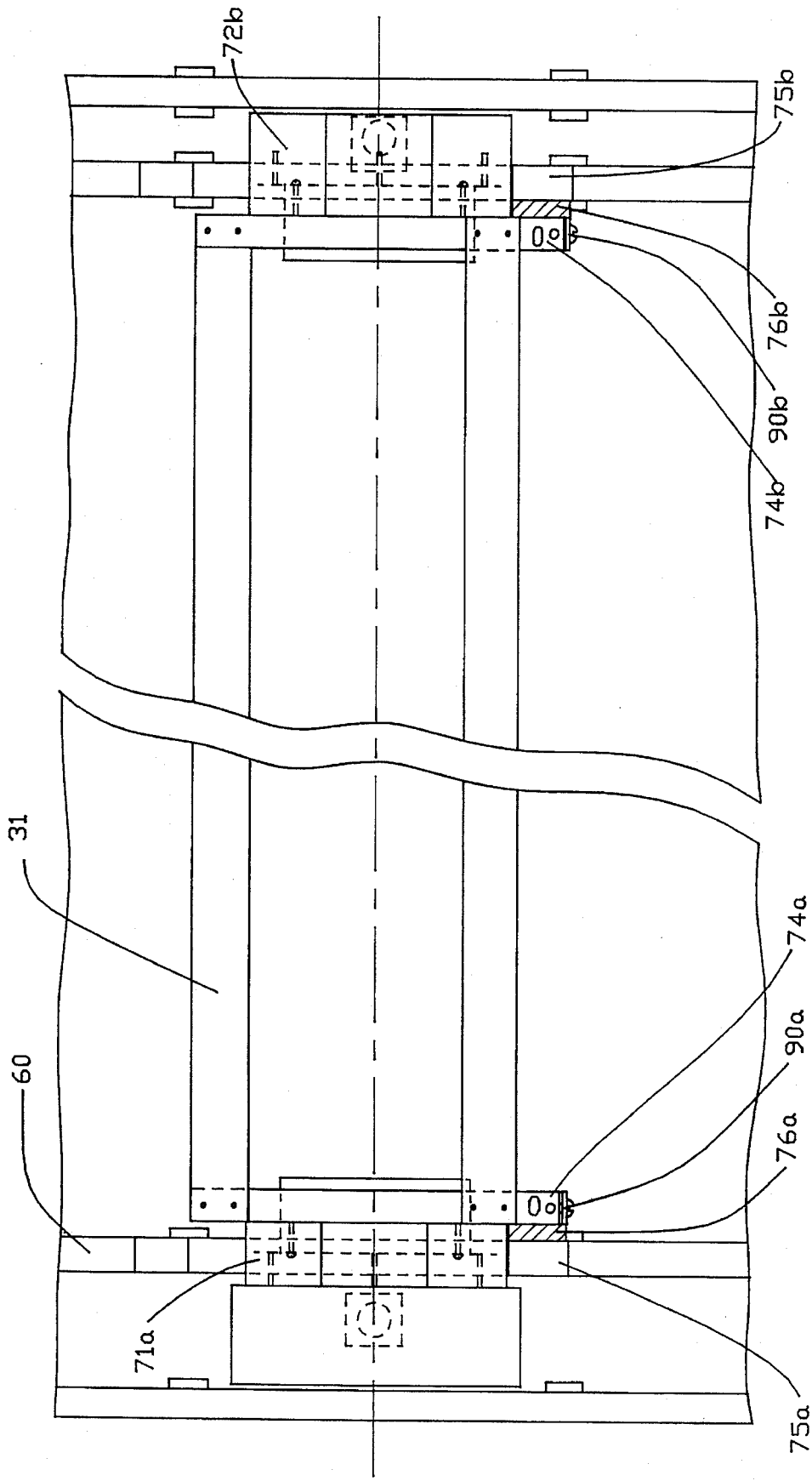
FIG.—7A

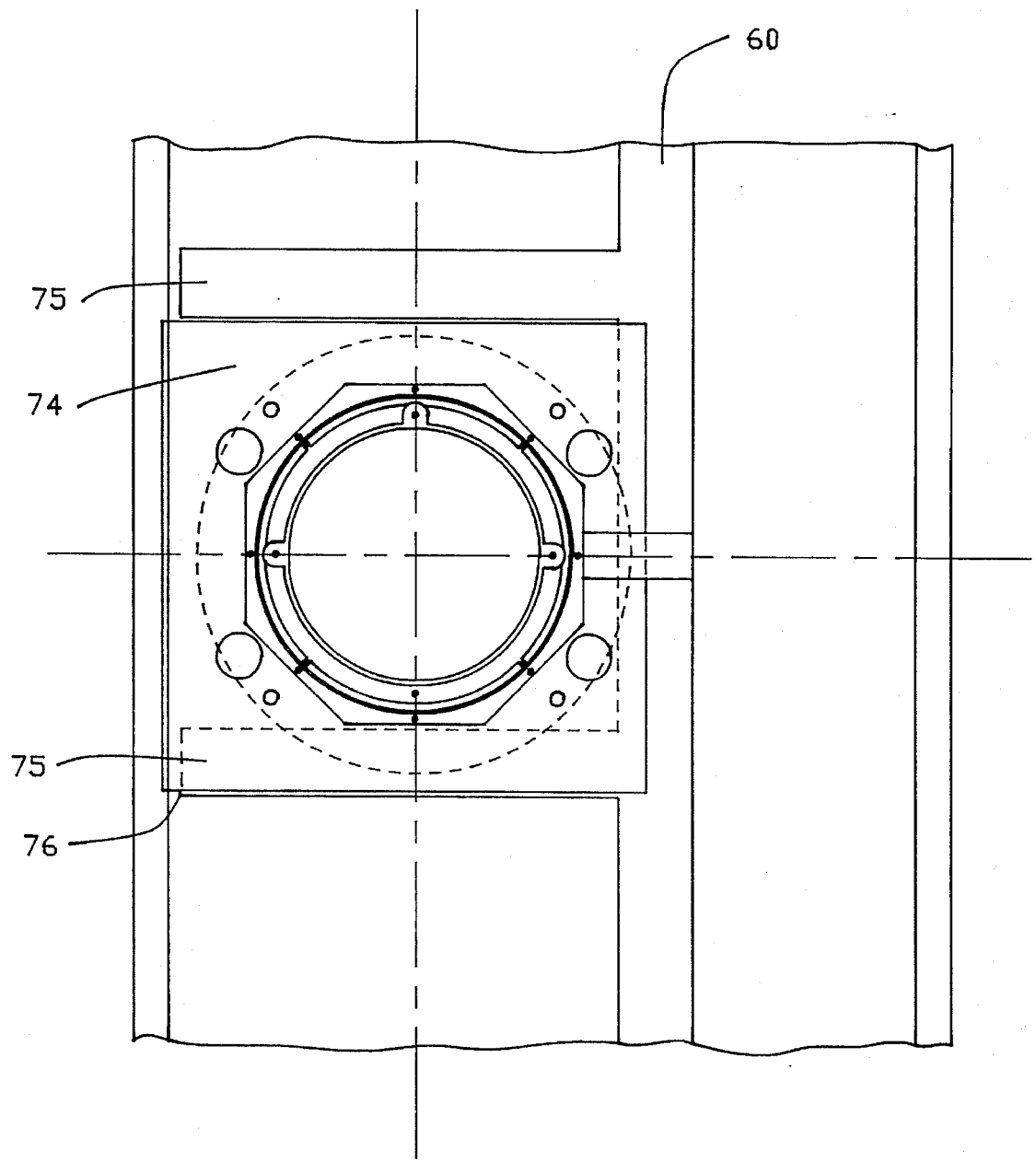
FIG.—7B

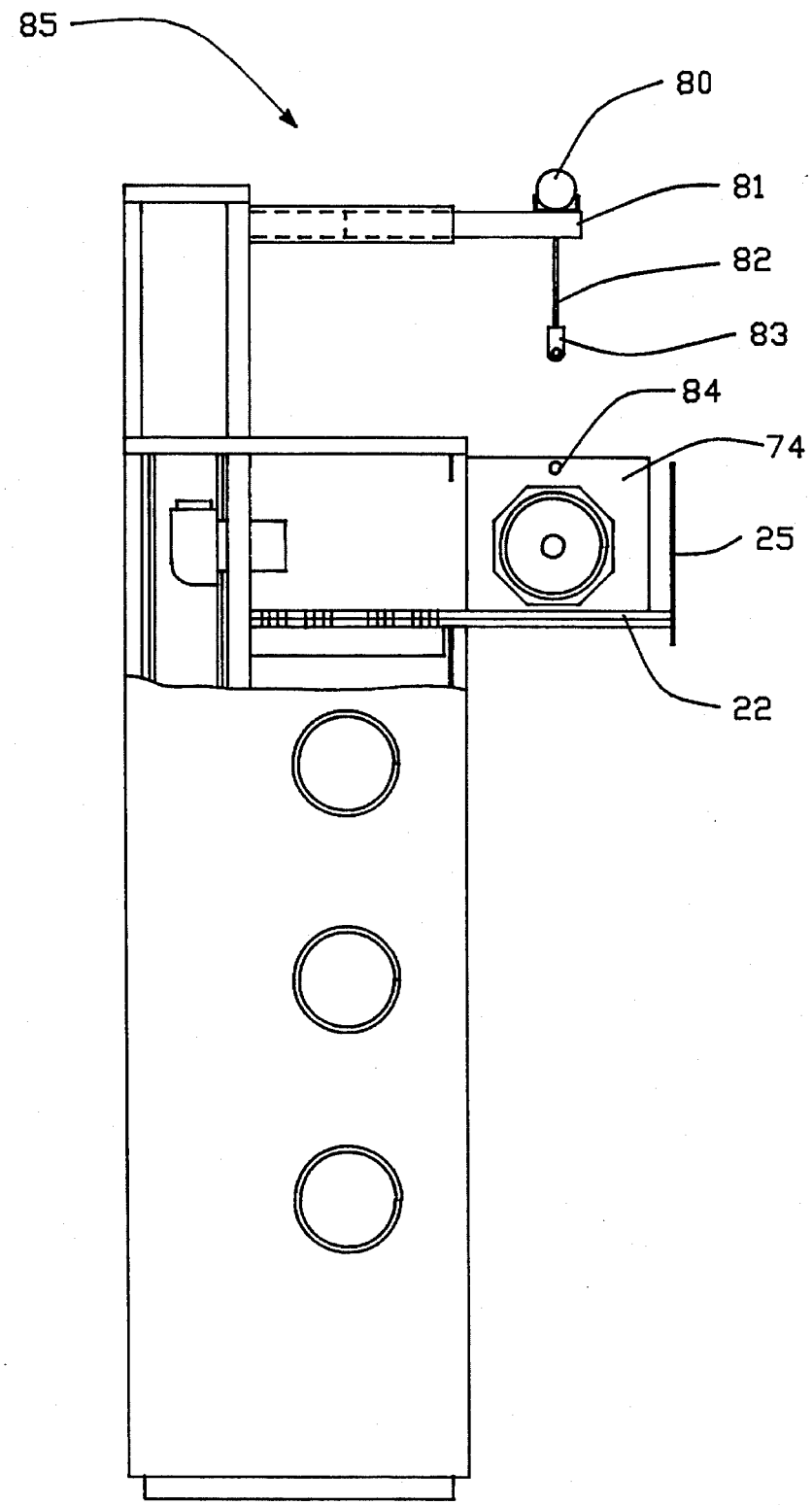
FIG.—8

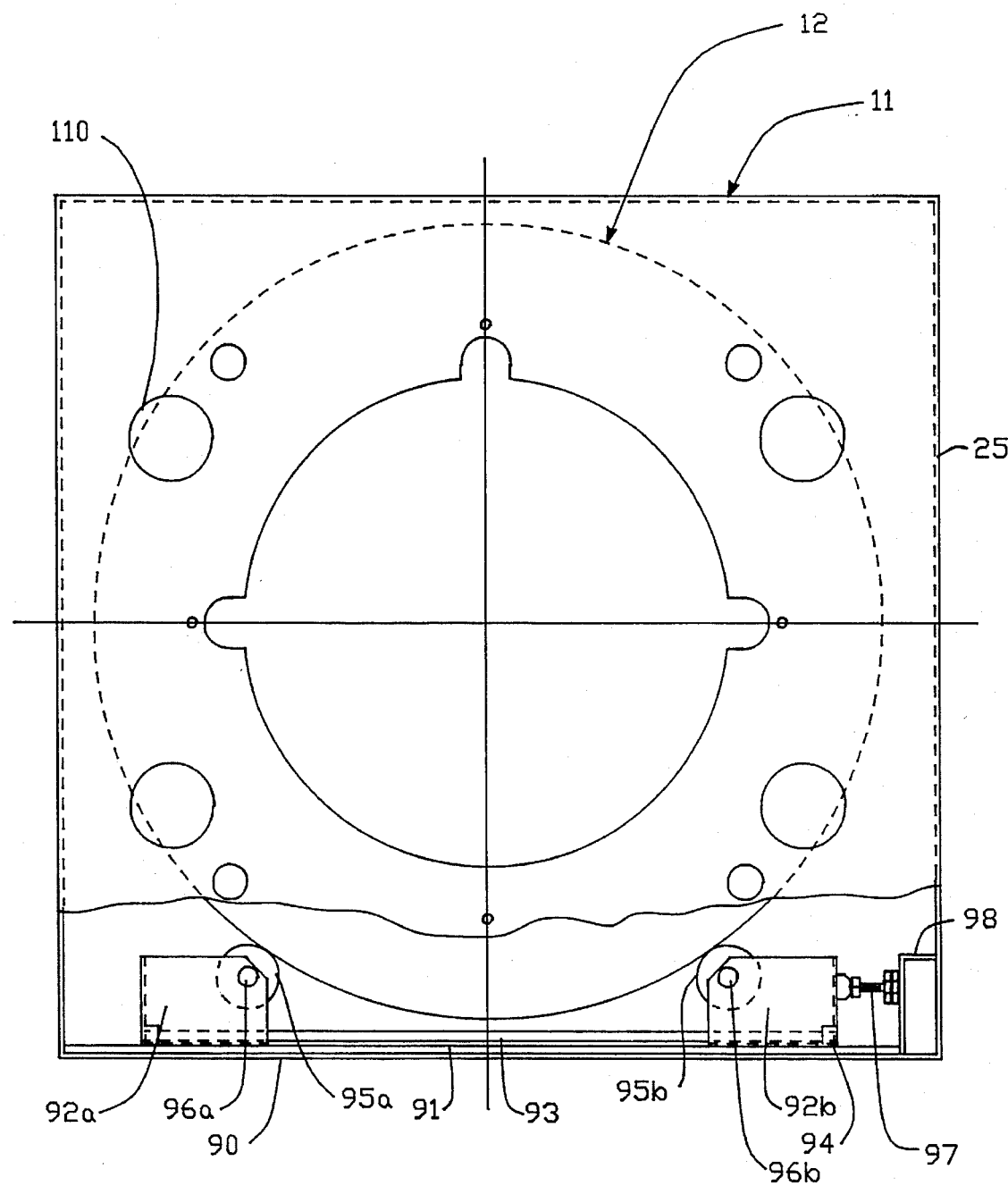
FIG.—9

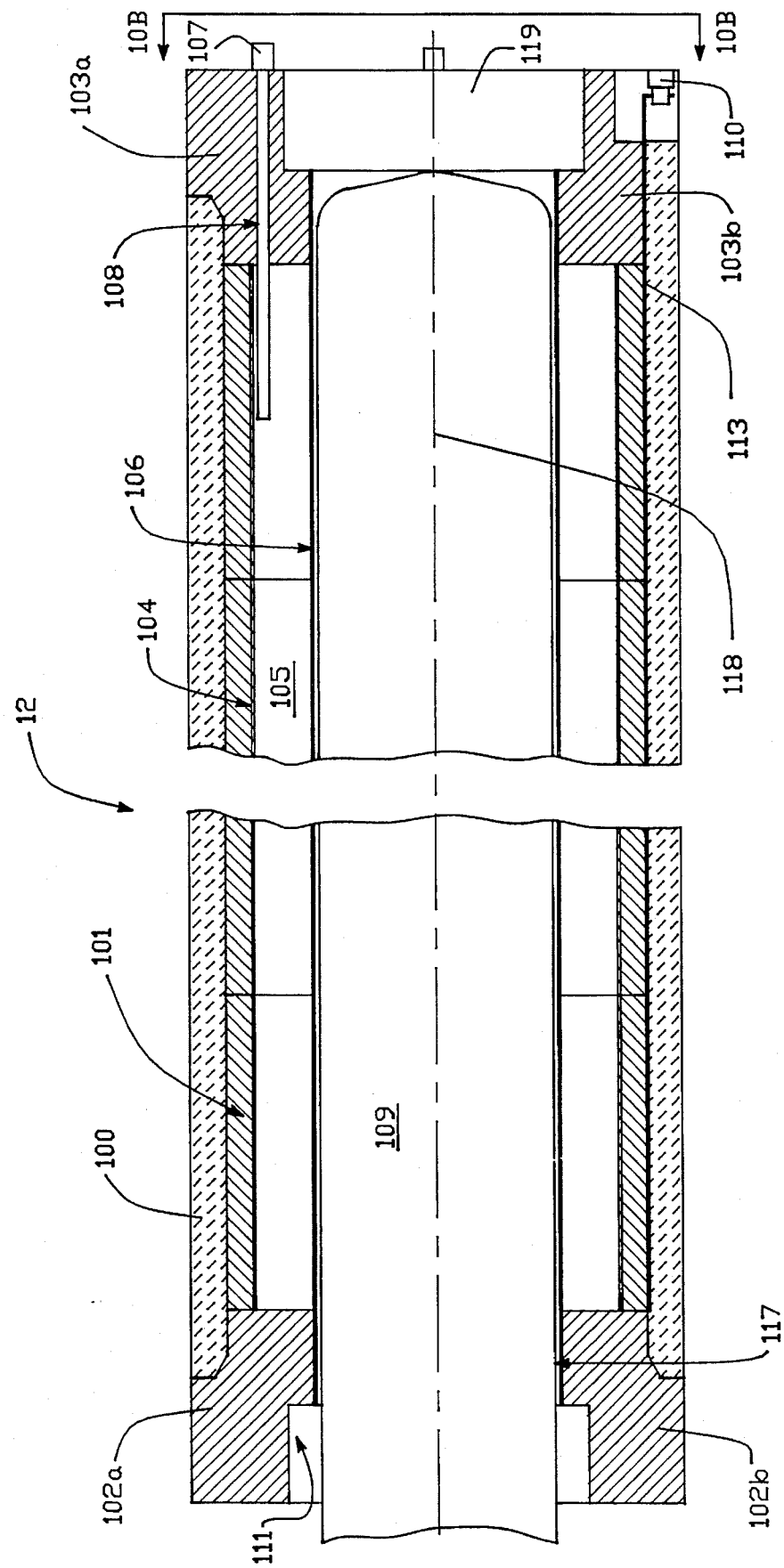
FIG.—10A

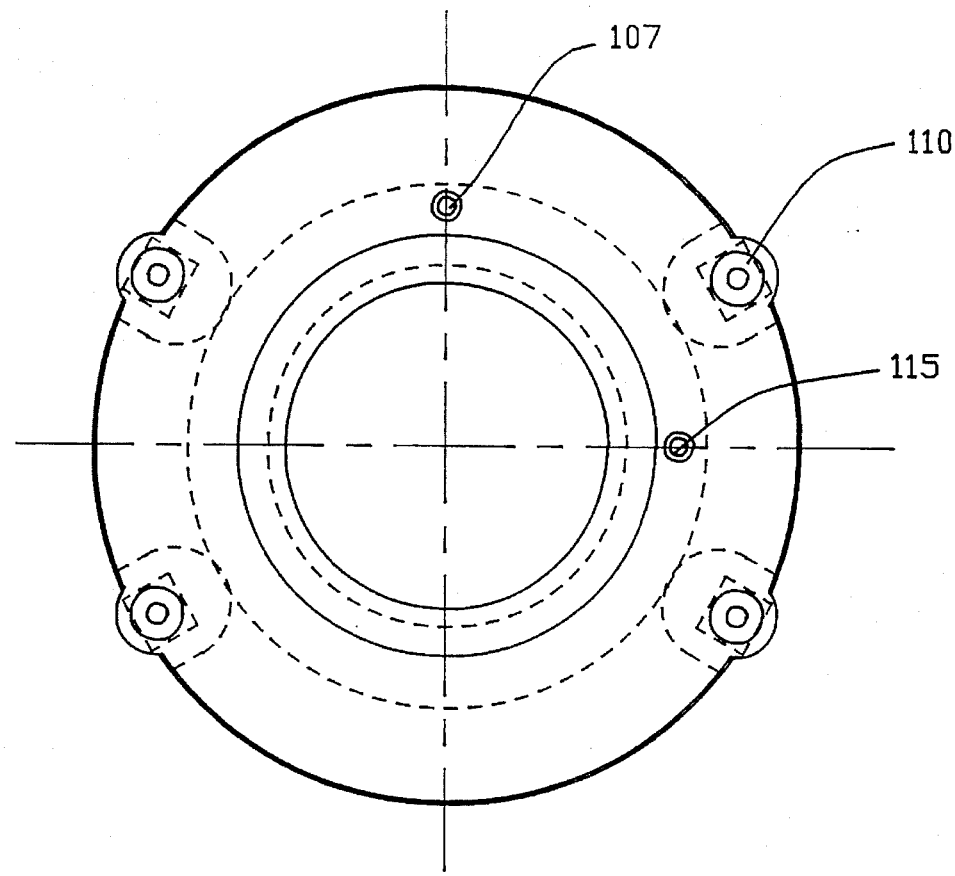
FIG.—10B
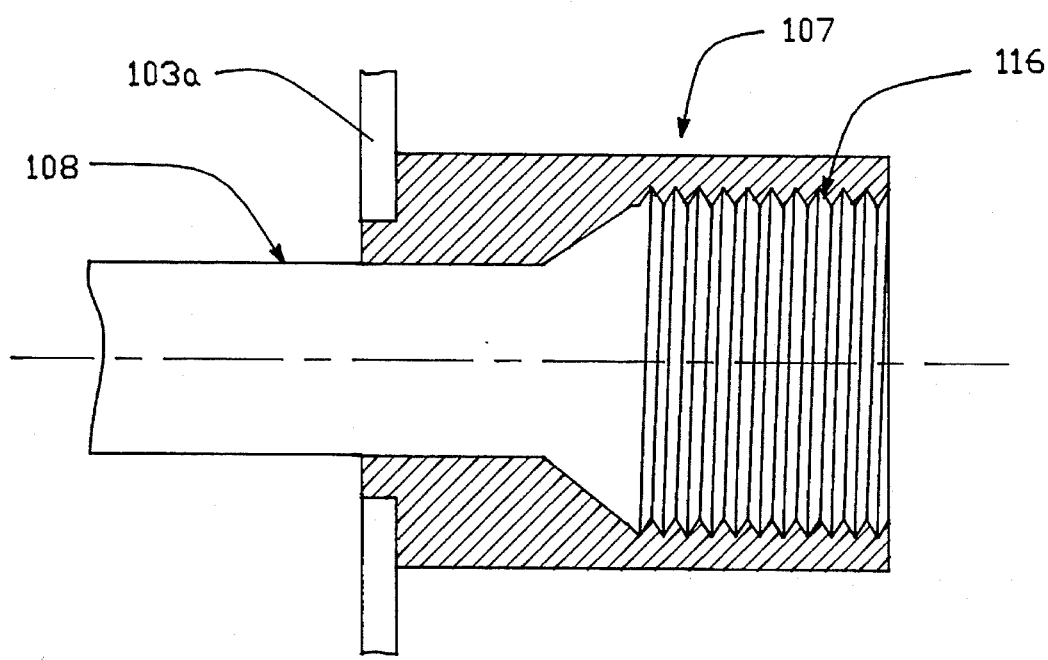
FIG.—10C

APPARATUS FOR POSITIONING A FURNACE MODULE IN A HORIZONTAL DIFFUSION FURNACE

This application is a divisional application of Ser. No. 07/898,552, filed Jun. 15, 1992, which is currently pending.

FIELD OF THE INVENTION

The present invention is directed toward high temperature diffusion process furnaces typically used in the semiconductor industry.

BACKGROUND OF THE INVENTION

High temperature diffusion furnaces are well known to the semiconductor industry. Heat treatment in high temperature diffusion furnaces is one of the many steps in the manufacturing process of silicon wafers. Typically, process gas is injected into the heat treatment process in order to alter the composition of the wafers. For example, heat treatment of wafers with an appropriate process gas allows doping elements such as boron to be introduced into the molecular structure of the semiconductor material.

A high temperature diffusion furnace may include multiple furnace modules capable of heat treating multiple sets of silicon wafers. The individual diffusion furnace modules comprise a heating element which includes a process chamber for a process tube which is shielded by a liner. The process chamber has a load end where the wafers are inserted and a source end where process gas is injected. In addition, scavenger boxes are included to remove excess process gas along with an energy kit. Typically, the furnace modules are housed in a stacked orientation.

The heating elements are generally cylindrical in shape and symmetrical. The heating elements have an outer metallic housing, usually comprised of stainless steel or aluminum, and inner layers of insulating materials such as ceramic fiber. A furnace chamber is created between heating coils and a heating element liner. Several heating coils are secured together to form a continuous coil, with the middle heating coil enabling optimal temperature at the middle of process tube. The end heating coil is operated to enable a temperature in the process tube sufficient to overcome losses out the end of the furnace and to preheat any gasses being introduced into the furnace. The heating coil is generally a helical resistance wire made of chrome-aluminum-iron alloy, the wires generally heavy gauge (0.289" to 0.375" in diameter) for extended heating coil life at an elevated temperature.

The maximum permissible operating temperature for the heating coil alloy is 1400° C. Since a temperature differential exists between the heating coil and the inside of the process tube, diffusion furnaces are normally operated at a maximum operating process tube temperature of 1300° C.

Silicon wafers are heat treated in the middle section of the process tube. The process tube is fabricated of quartz, polysilicon, silicon carbide or ceramic. The process tube in sheathed by a liner which separates the heating coils from the process tube creating a furnace chamber. The silicon wafers to be heat treated are mounted onto boats and loaded either manually or automatically into the center of the process tube from the load end of furnace. The boats used to hold the wafers are generally fabricated of quartz, polysilicon, silicon carbide or ceramic.

Multiple furnace module configurations have increased heat treatment process capability and flexibility. Separate heat treatment processes at various stages may be performed in separate process tubes simultaneously. However, a system incorporating a multiple furnace module configuration increases the likelihood that a process in one furnace module may be affected by processes in other furnace modules, Moreover, a failure of a single furnace module may effect the ability to process wafers in other furnace modules. These limitations of multiple furnace module designs, as well as heating element design limitations which affect the performance of the heat treatment process, are as follows:

Furnace Material

Typically, prior art furnaces are constructed with painted steel frames with aluminum or steel panels. While the materials used for the construction of the furnace have suitable strength, weight and thermal conductance characteristics, the surfaces are relatively irregular and non-uniform.

The semiconductor manufacturing process is performed in low particle environments or clean rooms. Furnaces may be placed in these clean rooms or adjacent grey rooms. Grey rooms require a less stringent atmospheric particle standard than clean rooms, yet are relatively particle free.

The materials used to construct equipment housed in a clean or grey room should have surfaces as uniform as possible with minimum surface irregularities.

Typically, furnaces are positioned in grey rooms with the process tube accessible from the clean room. Therefore, the exterior surface of the furnace should be compatible with a clean room environment while consistent with furnace material requirements.

Furnace Leveling

Prior art furnaces use individual leveling mounts to level the furnace. Generally, the individual level mounts are positioned at the bottom corner area of the furnace. Each individual mount may be adjusted to lower or raise the corresponding corner of the furnace in order to level the furnace.

The use of individual leveling mounts in a high temperature diffusion furnace has introduced three problems. First, when the furnace is moved to another location or first installed, the individual leveling mounts are susceptible to breakage. If the furnace is slid across the floor, excessive side loading may be applied to the individual leveling mounts causing deformation or breakage. Second, the individual leveling mounts create an open area under the furnace where debris may collect which is difficult to access for cleaning. Finally, the individual leveling mounts may restrict the weight distribution of the furnace and may not meet seismic requirements. Therefore, while the individual leveling mounts allow for positioning of the furnace, they introduce multiple disadvantages in the prior art furnace design.

Furnace Module Access

Access to the individual furnace modules for repair and maintenance is generally difficult and time consuming. Furnace tube modules are normally accessed at the load end or source end of the process chamber requiring extensive disassembly of the furnace. Multiple disconnections and removal of components are necessary in order to remove the heating element. For example, all power connections are with nut and bolt type connections which need to be removed. Furthermore, these connections have a tendency to loosen over a period of time and require retightening to prevent overheating from oxidation due to poor electrical contact.

Access to the furnace module is further complicated by the size and weight of the heating element. A heating element can weigh as much as 200 lbs. This complicated removal of the heating element requires a significant amount of manhours to repair or maintain an individual heating element, which adds significantly to the overall cost of operating the furnace. In addition, the safety of the maintenance personal is at risk because there is no mechanism for removing and positioning the heating element.

Furnace Heating Element/Process Chamber Interface

The heat treatment of the wafers may be compromised by interaction of process gas with the furnace heating element. Typically, process gas is injected into the process tube from the source end while the furnace is placed in a grey room with the load end accessible from a clean room. Clean rooms reduce introduction of unwanted particles by creating a pressure differential between the clean room and adjacent rooms by maintaining a higher pressure in the clean room. This pressure differential between the load end and the rest of the furnace element can cause air currents to flow through the gaps around the process tube and the vestibule blocks, into the furnace chamber and finally out the gaps at the source end of the furnace. Process gas byproducts exiting the process tube at the load end may be carried into the furnace chamber by these air currents where they can react with the heating element wire and shorten the life of the heating element. The temperature non-uniformity introduced by the turbulence in the furnace chamber then may affect the uniformity of the heat treatment of the wafers.

The process gas may also react with the heating coils to produce unwanted by-products which may react undesirably with the processing of the semiconductor wafers.

In addition to the undesirable reaction of process gas in the furnace chamber, the heating element may also directly corrupt the wafers. Prior art heating elements use heavy silicon carbide liners to provide protection against heavy metal migration from the heating element materials of construction through the quartz process tube. Migration of the heavy metal may damage the silicon wafers being processed within the tube. The heavy liners are constructed totally of silicon carbide and are approximately ¼ inch thick (6–7 mm). The weight of the silicon carbide significantly slows the response characteristics of the heating of the process chamber.

Furnace Cooling

Residual heat and cooling from furnace modules may also introduce non-uniformities into the wafer fabrication process. For example, one furnace module may be operating at a steady state temperature while an adjacent furnace module may be heating up to a high temperature. The increase in energy loss from the shell of a furnace module which is heating up may change the ambient temperature of the adjacent furnace modules which are in steady state. This requires the control system to respond by making adjustments to maintain the desired temperature inside the process tube. However, the adjustments in the control system contribute to temperature instability.

In the prior art, multiple furnace module configurations are cooled by a single cooling system. Generally, a single forced air flow is generated by fans placed at the top of the furnace. A single flow of forced air is directed from all of the furnace modules and eventually out an exhaust at the top of the furnace. This single cooling system for all the furnace modules eliminates the capability of running heat treatment processes in the other furnace modules when repairs or maintenance to the cooling system are necessary.

Thermocouple Positioning and Composition

In order to enhance the performance of the heat treatment process, the furnace chamber must be measured precisely within a fraction of a degree at very high temperatures in order to control the temperature of the furnace chamber. However, the composition and position of the thermocouples used to measure the furnace chamber have limited precision.

Present thermocouples are inserted into the furnace chamber through the side of the heating element, perpendicular to the center line axis of the process tube. This positioning has limited the thermocouple's ability to read actual temperatures in the furnace chamber because the thermocouple is not sufficiently immersed into the heating chamber. In order to obtain accurate measurements, the thermocouple should be sufficiently immersed into the furnace chamber at least six to eight times the diameter of the thermocouple to overcome heat loss or heat sink effect of the thermocouple leads and supporting ceramic sheath. For example, a 3/16 inch diameter thermocouple requires at least one and ⅛ inch to one and ½ inch of immersion into the furnace chamber in order to properly read actual furnace chamber temperature.

The perpendicular placement of the thermocouple also increases the likelihood of obtaining inaccurate temperature readings when the process tube is removed from the furnace module. In prior art systems, when the process tube needs to be removed for maintenance or repair, it is necessary for the thermocouples to be withdrawn from their operating position so that the removal of the process tube does not damage the thermocouples. When the process tube is reinserted, the repositioning of the thermocouples to their original position is very difficult. Therefore, the heating element must be re-profiled to obtain the required uniformity within the heating element.

High current pulses required by the heating element also introduces inaccuracies into the thermocouple's measurement of furnace temperatures. The helically coiled, heavy-gauge wire used in the heating element requires high current for operation. However, this high current pulsed on-and-off for tight control by zero-crossover, silicon controlled rectifiers causes radio frequency interference (RFI) to be induced onto the thermocouple measuring circuit. The induced RFI causes errors in the control signal which make it difficult to control all the heating element within tight temperature tolerances, such as ±0.10° C. as required by many of todays semiconductor processes.

SUMMARY OF THE INVENTION

The present invention is directed to overcoming the disadvantages of the prior art furnaces. The purpose of the present invention is to provide a furnace which achieves high process performance while enhancing maintainability.

Accordingly, the present invention includes a high temperature diffusion furnace for use in a low particle atmospheric environment comprising a frame having at least a portion consisting of stainless steel with enhanced surface uniformity and a plurality of panels attached to the frame with at least a portion of the panels consisting of aluminum and polyethylene.

The invention further includes an apparatus for adjusting the position of the furnace relative to a floor comprising a base coupled to a frame supporting the furnace and a plurality of leveling frame assemblies for adjusting a distance between the frame and base.

Furthermore, the invention includes an apparatus for allowing access to a furnace module which contains a heating element with opposing ends. The frame supporting the furnace has cantilever members extending from a back side to a front side of the furnace with a drawer slider attached to the cantilever members. A bulkhead coupling the drawer slider to the cantilever member and heating element end allows for the heating element to be extended toward the front side.

The invention also includes an apparatus for positioning a heating element comprising a beam coupled to the furnace with a plurality of cables extending from the beam and means for attaching the plurality of cables to the heating element. Means for moving the plurality of cables allowing the heat element to be positioned is also provided.

A further aspect of the invention includes an apparatus for positioning a heating element in the furnace comprising an element chamber including an element chamber platform with a low friction surface portion and a side. A first sled is coupled to a second sled which is positioned over the low friction surface and supporting the heating element end. The first sled is separated by a first distance from the second sled with both sleds separated by a second distance from the element chamber side. Means for adjusting the first distance between the sleds allowing the heating element end to be raised or lowered relative to the element chamber platform and means for adjusting the second distance allowing for the sleds to position the heating element end relative to the element chamber side is provided.

In yet another aspect of the invention, the invention includes an apparatus for enhancing the heat treatment process in the furnace comprising a cylindrical heating element having furnace chamber surrounding a process chamber with an opening at the load end. A process tube is in the process chamber for containing process gas along with a receptacle in the heating element at the load end. Means for sealing the furnace chamber from the process gas is coupled to the receptacle.

In a further aspect of the invention an apparatus for cooling a plurality of heating elements which are radiating thermal energy using a source of air is provided. The apparatus comprises a furnace panel with an intake vent and means for extracting the source of air through the intake vent producing a flow of air across a first heating element radiating thermal energy which transfers the thermal energy of the first heating element to the flow of air and means for separating the flow of air across the first heating element from a second heating element.

In another aspect, the invention includes an apparatus for measuring thermal energy in a furnace having a radio frequency interference energy field. The apparatus comprising a plurality of wire leads with ceramic insulating a substantial portion of the wire leads allowing for a small exposure of the wire leads to be used for measuring thermal energy while silicon carbide coats at least a portion of the ceramic removing radio frequency interference energy.

In yet another aspect, the invention includes an apparatus for measuring the temperature in the furnace comprising a cylindrical heating element with a furnace chamber and process chamber with a source end. The furnace chamber has a bore for sufficiently inserting a thermocouple into the bore allowing for precise measurements of the furnace chamber.

BRIEF DESCRIPTION OF THE DRAWINGS

FIG. 3 depicts a top view of the high performance furnace.

FIG. 5 depicts an enlarged, cross-sectional view of one part of the leveling frame assembly.

FIGS. 6A–6B show a side view of the cooling system with the furnace modules removed and a load end view of the cooling system for the individual furnace modules, respectively.

FIGS. 7A–B depict a slide out assembly of a furnace module with a side panel removed and a source end view of a side out assembly of a furnace module, respectively.

FIG. 8 depicts a heating element change hoist.

FIG. 9 depicts a cross-sectional view of a heating element alignment mechanism.

FIGS. 10A–B–C depict a cross sectional side view of a heating element, source end view of a heating element and cross sectional view of a thermocouple mount, respectively.

DETAILED DESCRIPTION OF THE PREFERRED EMBODIMENTS

Figure 1:
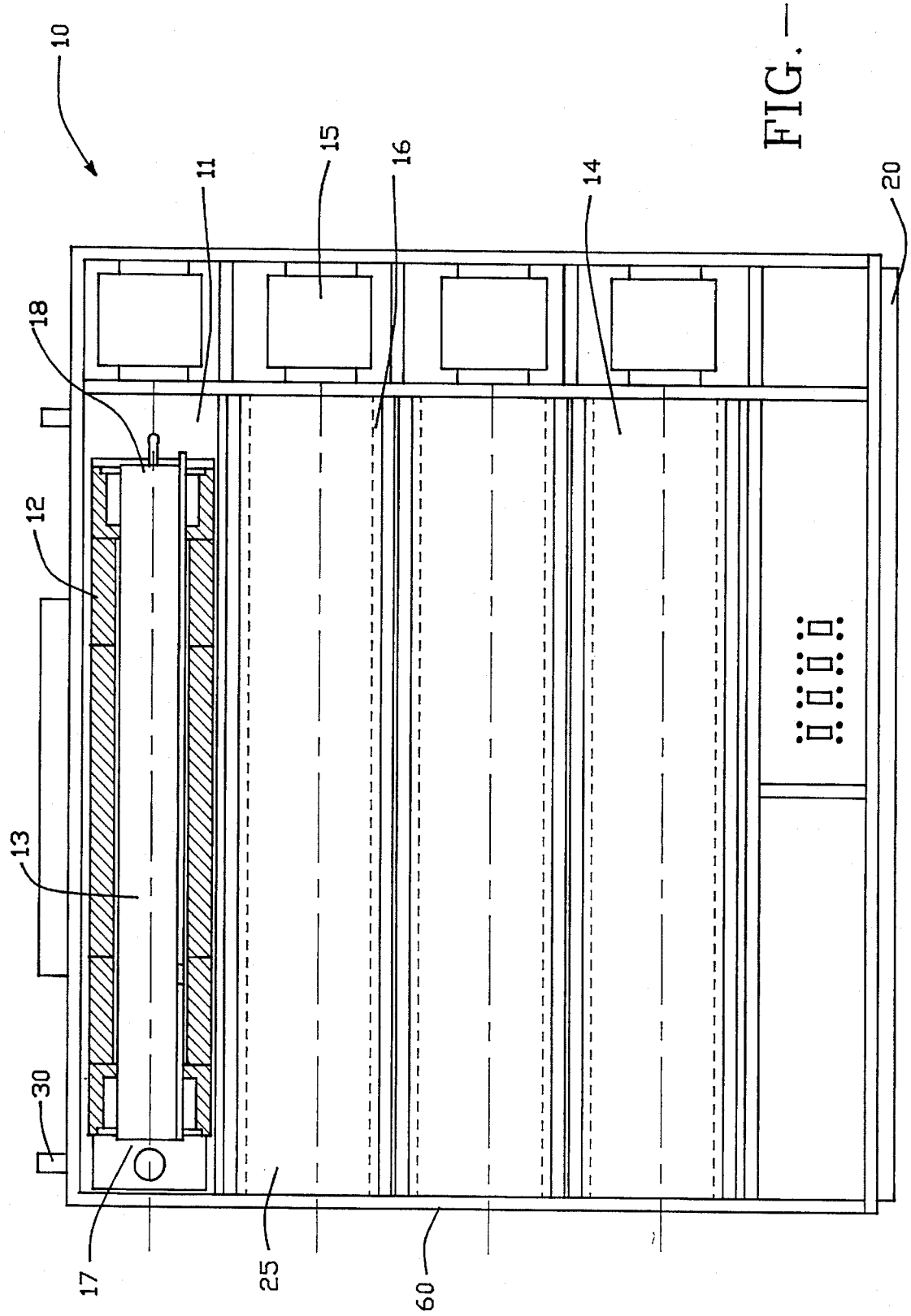
FIG. 1 depicts a side view of the high performance furnace.

A side view of the high process performance furnace 10 is shown in FIG. 1. In one embodiment, furnace 10 comprises four element chambers 11. Each element chamber has an element chamber panel 25. The element chamber panel 25 has air intake vents 16 for extracting cooling air. In FIG. 1, element chamber panel 25 for the uppermost element chamber has been removed to show heating element 12. The heating element 12 has a load end 17 for inserting the silicon wafers. Source end 18 is at the opposite end of heating element 12. A boat of wafers to be heat treated may be loaded into process tube 13. Gas trays 15 control the amount of process gas allowed into the process tube. Excess gas and process gas byproducts are collected through scavenger ducts (not shown) and exhausted through scavenger exhaust 30. Furnace 10 is leveled during installation or after transfer by leveling frame 20.

All materials used for furnace 10 are suitable for use in a clean room. Frame 60 is constructed of series 304 stainless steel which is finished to a mirror polish. Furnace panels are either of stainless steel construction or a coil-coated composite of aluminum/polyethylene/aluminum. In one embodiment, 3 mm panels of ALUCOBOND® manufactured by Alucobond Technologies of Benton, Ky. are used. The panels are attached to the frame with very high bond tape and standard fasteners.

The polyethylene and aluminum composite has distinct advantages over the aluminum used in conventional furnaces. The polyethylene and aluminum composite weighs approximately 56% of aluminum. The thermal conductance is also a fraction of aluminum with the thermal conductance of the composite being approximately 0.3% of aluminum. The coil-coating finish is uniform, consistent and very durable.

Figure 2:
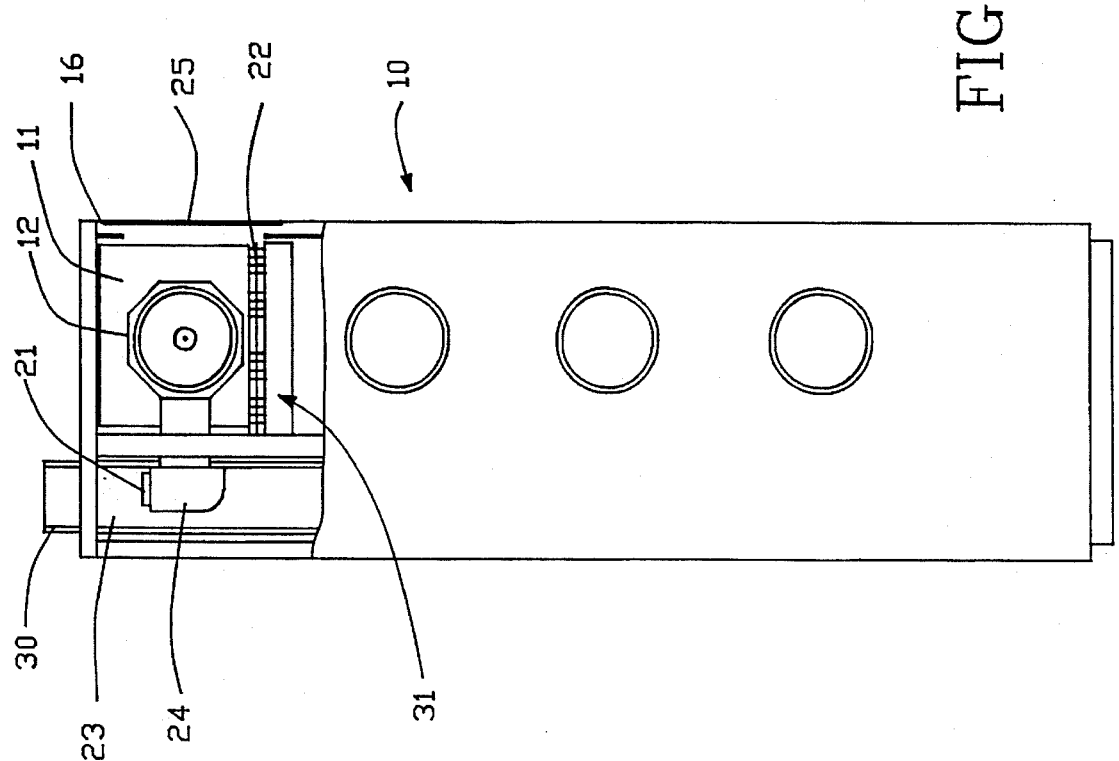
FIG. 2 depicts a load end view of the high performance furnace.

The load end view of the high performance furnace 10 is shown in FIG. 2, with a cutaway of the uppermost element chamber 11. The air intake vent 16 is recessed and allows for air to be extracted from the surrounding environment and blown over heating element 12. Fan housing 24 contains a fan for extracting air from, for example, a grey room, which is then exhausted through flume 23. Further details on the cooling of each individual heating element 12 will be described below.

A portion of slide out assembly 31 is also shown in FIG. 2 which allows for access to heating element 12 and enables removal of the process tube as well as other furnace module components in element chamber 11. Heating element 12 is placed on drawer sliders 22 which may be extended from the side of the furnace during maintenance or inspection.

Heating element 12, which is accessible by slide out assembly 31, is shown in the top view of the high performance furnace 10 in FIG. 3. Top panel 32 covers heating element 12 which is placed on slide out assembly 31. Scavenger exhaust outlet 20 for removal of heated air and process gas byproducts are also shown. Further details on the slide out assembly will be described below.

Figure 4:
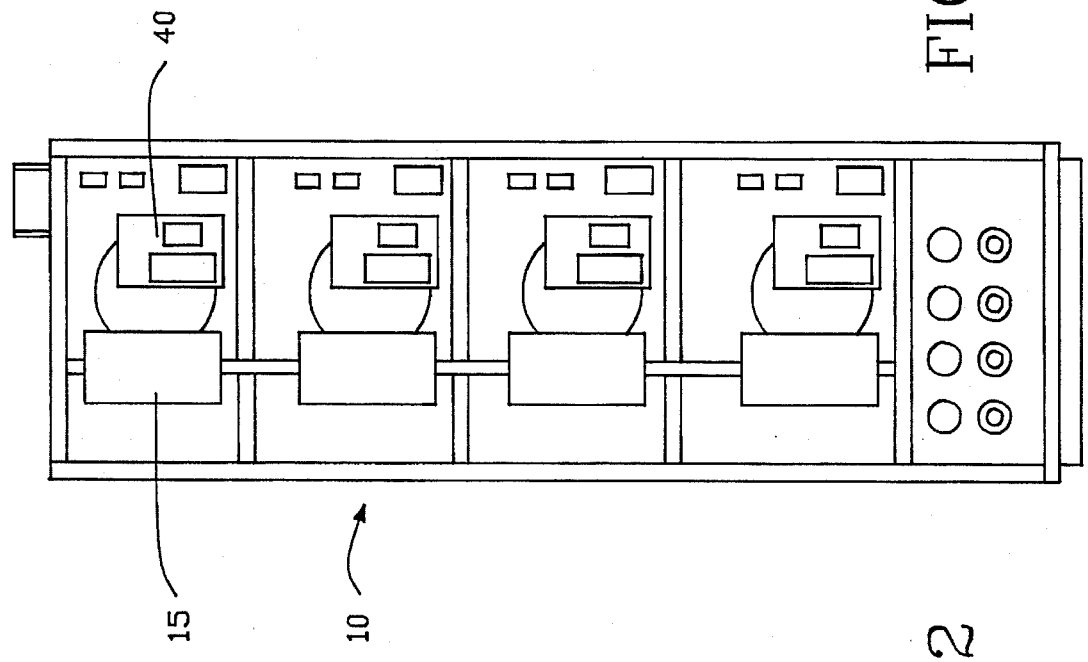
FIG. 4 depicts a source end view of the high performance furnace.

FIG. 4 depicts the source end view of the high performance furnace 10. Individual control panels 40 and gas trays 15 control the individual heat treatment process for the various process chambers.

Leveling frame assembly 59 for furnace 10 is shown in FIG. 5. Frame 60 is connected to leveling frame base 20 by bolt 55. Washer 54 is placed between bolt 55 and frame 60. Nut 51 is welded to level frame base 20 with bolt 55 extending through frame 60 and nut 51 into level frame base 20. Washer 53 is placed between nut 52 which is welded to bolt 55.

The level of furnace 10 may be adjusted by accessing a level frame assembly 59 at the lower portion of the furnace. A lower furnace panel may be removed to expose leveling frame assembly 59. Bolt 55 may then be wrenched allowing a corner of the frame 60 to be raised or lowered.

Figure 6B:
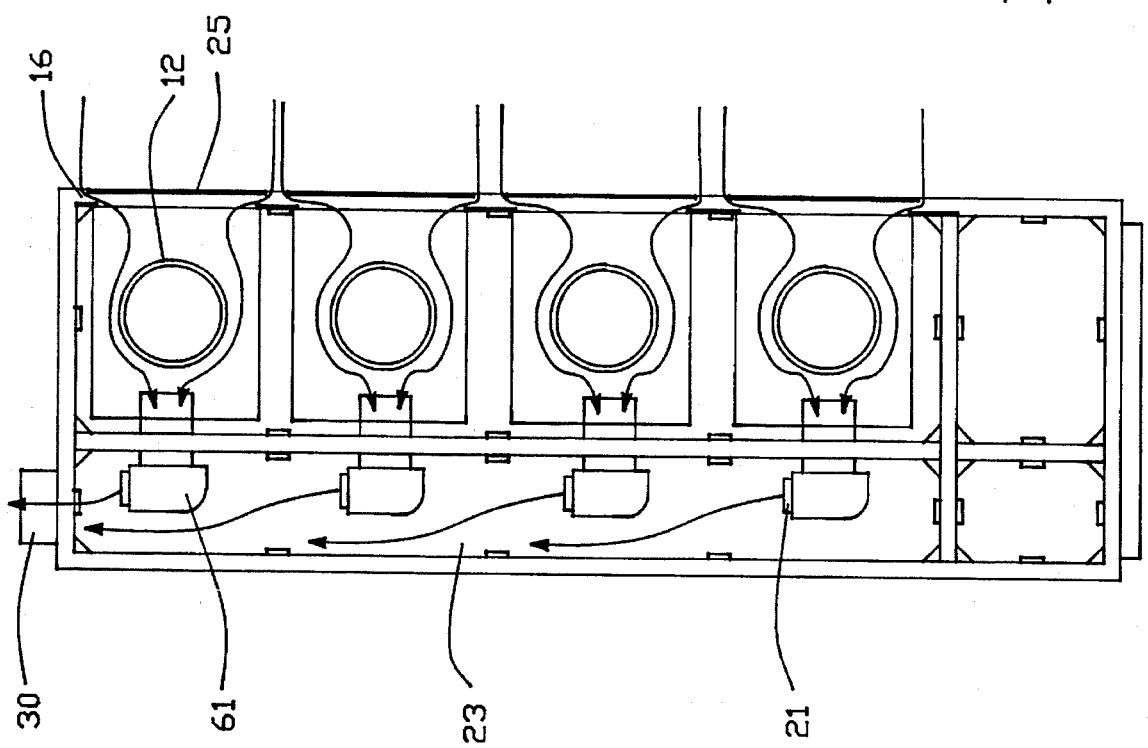

The individual heating element cooling system is shown in FIGS. 6A–B. The individual furnace cooling system reduces the transfer of thermal energy to adjacent heating elements. Cooling air which is heated by one heating element is not directed over another heating element.

Frame 60 supports two fan housing assemblies 61 per element chamber. Fan housing assemblies 61 are used to position axial blowers 65 to extract surrounding cooling air. The housing assemblies 61 are secured by back panel 66. The surrounding air is extracted through air intake vents 16 on the element chamber panels 25 across heating element 12. An air/water heat exchanger may be used to remove heat from the air. The heated air is then exhausted through fan assembly 61 through flume 23. Fan housing assembly 61 also contains a gravitational damper 21 which is closed when the axial blowers 65 are not in operation.

The cooling of each individual heating element is controlled separately. The power to axial blower 65 is controlled by circuit-breakers at the bottom of the furnace. The switching off of a circuit-breaker will remove the cooling to only an individual heating element. Therefore, maintenance to a single heating element which requires the cooling to be removed will not interfere with processing in other heating elements.

Slide out assembly 31 of heating element 12 is shown in FIGS. 7A–B. The slide view of side out assembly 31 is shown in FIG. 7A while a cross-section of the slide out assembly is shown in 7B. Cantilever 75a–b is attached to frame 60 to hold slide out assembly 31. Bulkhead 74a–b is affixed to cantilever 75a–b. Attachment 72a and 72b are affixed to bulkheads 74a and 74b, respectively. Bulkheads 74a and 74b are then attached to drawer slider 76a–b. Upon removal of element chamber panel 25, the slide out assembly then may be extended by the drawer slider 76a–b to allow access to heating element 12. Four screws at the bottom of the ledge 90a–b may be loosened to allow heating element 12 to be removed from the furnace.

A heating element positioner 85 is shown in FIG. 8. With heating element 12 extended from a furnace by drawer sliders 22, for example, an eyelet connector 83 may be attached to bulkhead 74 through opening 84. The eyelet connector 84 is coupled to cable 82 which may be attached to electric motor 80. Electric motor 80 is positioned on beam 81 which may be extended (as shown in FIG. 8) over extended heating element 12, or retracted when not in use. The electric motor 80 or other manual means, may be used to lower or raise heating element 12 by retracting or extending cable 82.

The mechanism for adjusting the position of heating element 12 in an element chamber 11 is shown in FIG. 9. The cutout section shows the alignment mechanism for heating element 12. In one embodiment, the heating element alignment mechanism rests on ledge 90 integral to the bulkhead assembly 74 which is coated with teflon skid pad 91. Other low-friction materials may also be used. Sleds 92a and 92b are positioned over the teflon skid pad 91. Sled 92a and sled 92b are connected by rod 93. The adjustment of bolt 94 either contracts or extends the distance between sleds 92a and 92b allowing for heating element 12 to be lowered or raised in the vertical direction relative to ledge 90. The lower cylindrical surface of heating element 12 rests on rollers 95a and 95b which are positioned by mounts 96a and 96b. Horizontal adjustment screw 97 is attached to sled 92b and station mount 98 which is located next to element chamber panel 25. Adjustment of horizontal adjustment screw 97 allows heating element 12 to be positioned in a horizontal direction by shifting sled 92a–b coupled with rod 93 away from station mount 98 or toward station mount 98. The system is designed to allow for vertical or horizontal adjustment of ±0.25 inches at both ends of the furnace.

A detailed illustration of heating element 12 is shown in FIG. 10A–C. Heating element 12 is covered with insulation 100 as shown in FIG. 10A. Ceramic fiber 101 is then placed between insulation 101 and heating coils 104. High amounts of current are introduced into coils 104 to increase the temperature of furnace chamber 105.

Furnace chamber 105 is then separated from process chamber 109 by liner 106 which is a lightweight silicon carbide impregnated high temperature ceramic fiber. Liner 106 provides protection against heavy metal migration from the heating coils 104 through the process tube 120 that may damage the silicon wafers being processed. The liner is very thin, (less than 3 mm thick) so it does not significantly slow the temperature response characteristics of the heating element during operation. The liner is a "Black Body" susceptor. Acting as a energy transmitter when heating and an absorber when cooling. Moreover, the liner acts as a heat pipe which allows for uniform heating of process chamber 109. In one embodiment, the liner used is SICONEX™ manufactured by Minnesota, Mining & Manufacturing Co., St. Paul, Minn. (3M).

End block 119 is placed at the source end of heating element 12 along the process tube center line axis 118. End block 119 is inserted into source end furnace vestibule blocks 103a and 103b. A ceramic sheath 108 is placed in source vestibule block 103 for the furnace chamber thermocouple. Thermocouple mount 107 is also attached to source vestibule block 103. A control thermocouple then may be inserted into mount 107 and through ceramic sheath 108 into furnace chamber 105. One of the four power plugs in connection 110 is placed below source vestibule block 103b. Power receptacle 110 allows for a plug-in power source at the source end which produces current on conductive path 113 to heat coils 104. The location and use of plug-in power connectors at the source end enable enhanced maintainability.

Source vestibule blocks 103a and 103b, as well as load end vestibule blocks 102a and 102b have furnace heating element receptacle 111. These recesses enable sealing of the heating element 12 which increases heating element reliability and allows for uniform heat treatment. The use of receptacle 111 along with a furnace element seal will be described below.

FIG. 10B illustrates the source end view of heating element 12. Thermocouple mounts 107 and 115 and the four power plugs in connection 110 are shown.

A cross-sectional view of thermocouple mount 107 is shown in FIG. 10C. Thermocouple mount 107 is attached to source vestibule 103a. The thermocouple mount 107 is threaded to allow mounting of the thermocouple. The angle formed between ceramic sheet 108 and threads 116 is chosen to remove any temperature transients from the thermocouple junction. In one embodiment, the angle is 37°.

Figure 11:
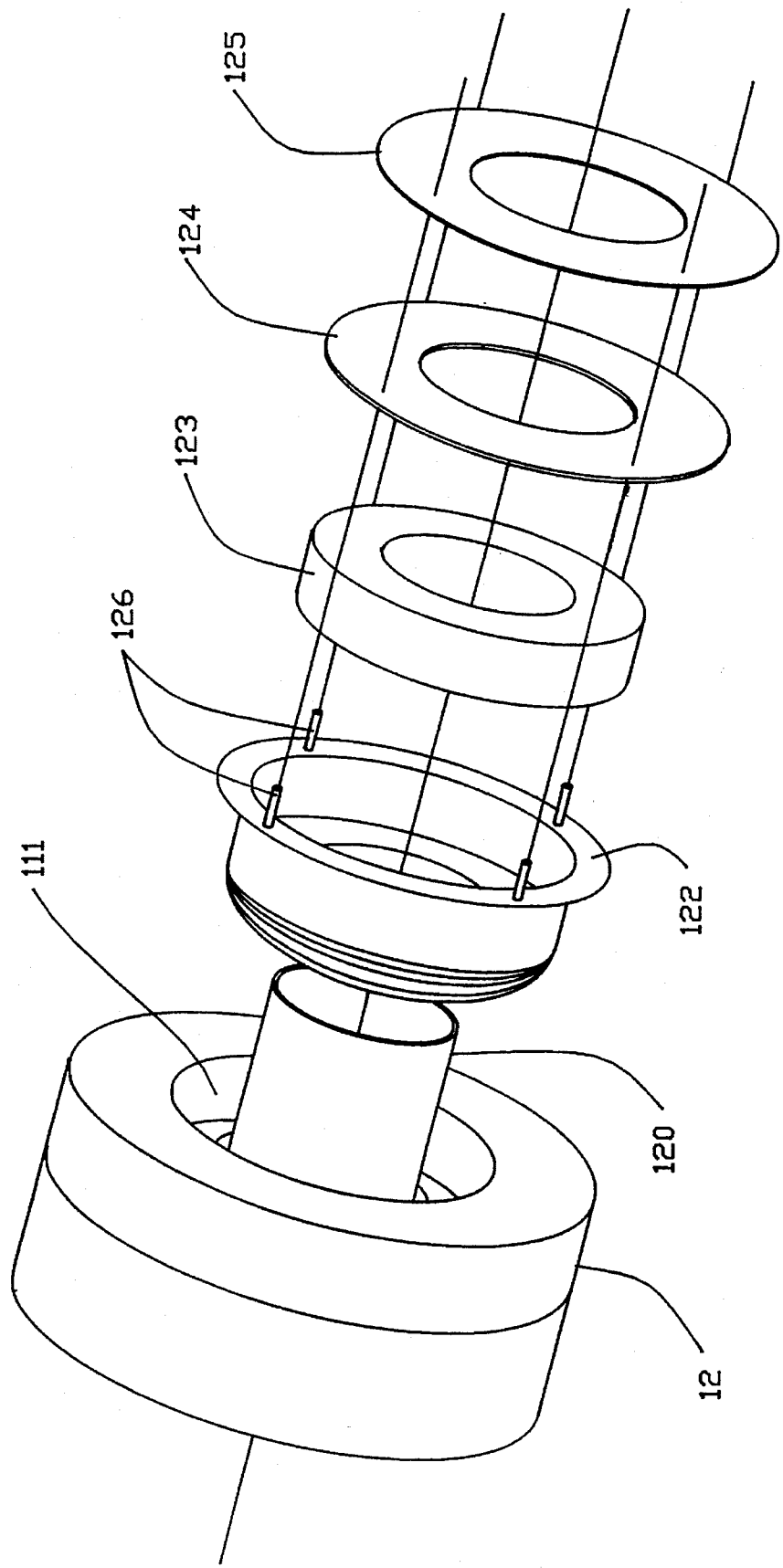
FIG. 11 depicts a heating element seal

A furnace element seal to prevent process gases entering the furnace chamber is shown in FIG. 11. Furnace heating element 12 has receptacle 111 to allow for insertion of ultraseal block 122 into receptacle 111 around process tube 120. Soft tube collar 123 is then inserted into ultraseal block 122. Nextel gasket 124 along with SS ring 125 are then attached to ultraseal block 122 by boles 126.

Figures 12A, 12B:
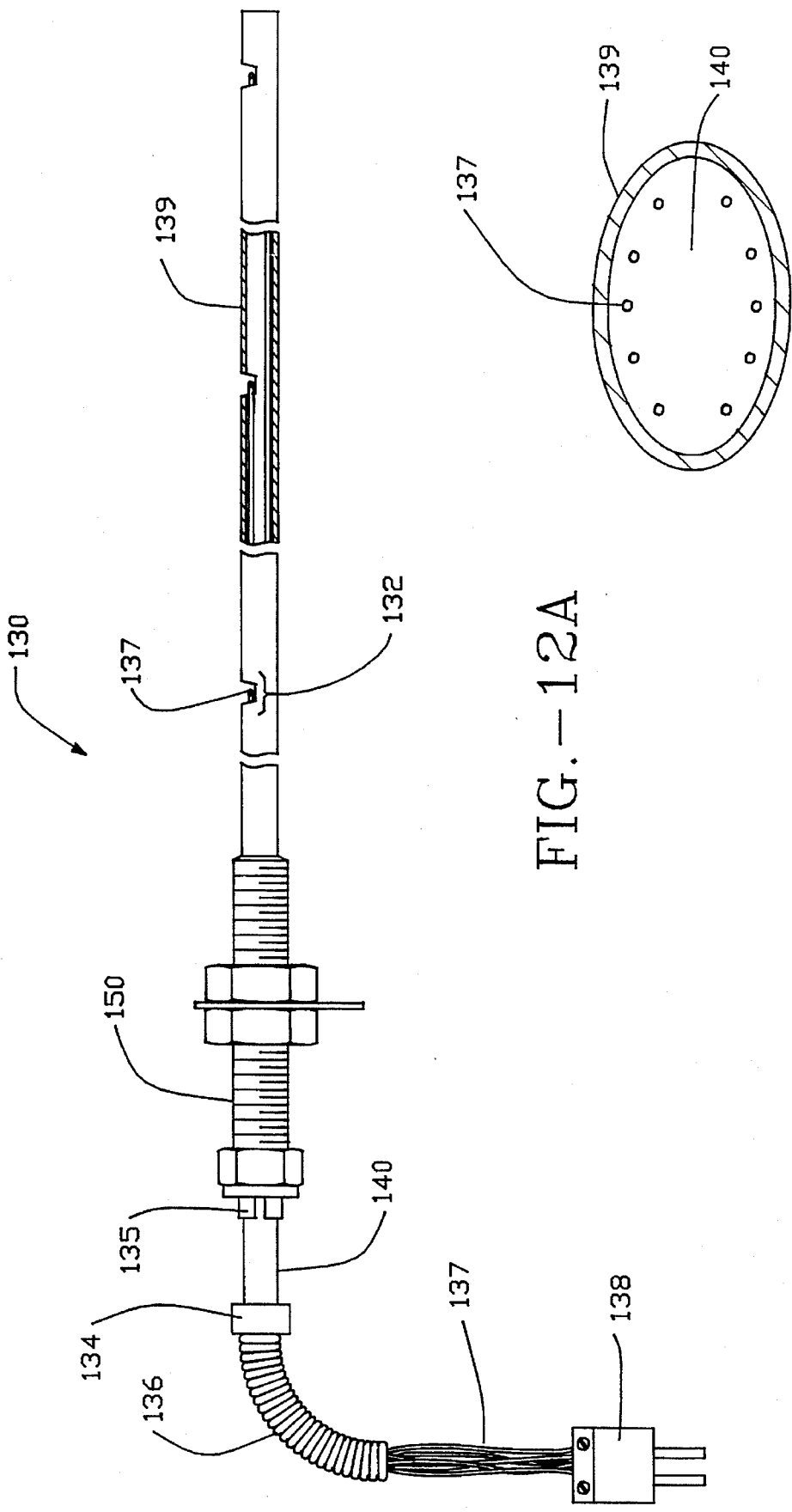
FIGS. 12A–B depict a side view and cross sectional end view of a thermocouple.

A control thermocouple 130 for the heating element furnace chamber is illustrated in FIGS. 12A and 12B. The thermocouple 130 comprises six thermocouple leads 137 in ten bores shown in cross-sectional view of the thermocouple in FIG. 12B. The thermocouple leads 137 are then encased in ceramic 140. The purity of the ceramic insulation is extremely important to the life and surface of a thermocouple. The thermocouple insulation should be high-purity alumina of at least 99.7% purity. Impurity levels should not exceed the following limits: $CaO$ 0.001%, $MgO$ 0.300%, $Na_2O$ 0.008%, $SiO_2$ 0.050%, $Fe_2O_3$ 0.026%, $TiO_2$ 0.001%, $Cr_2O_3$ 0.020% and $K_2O$ 0.001%.

Ceramic 140 is then encased in silicon carbide 139. The silicon carbide used in Siconex™, manufactured by 3M, is a low thermal mass, conduction material. The thermocouple leads 137 are exposed by indents in the silicon carbide 139 ceramic insulator 140 creating thermocouple junctions 132.

The ceramic electrical insulates the thermocouple's leads allowing the thermocouple to provide the correct EMF signal to the controller. The silicon carbide covering provides a conductive shield which can be grounded to minimize the amount of RFI that can be induced into the measuring circuit. The elimination of noise introduced by the RFI field allows for thermal control within a tenth of a degree.

This type of composite thermocouple is also used on a profile thermocouple located within the process tube. These thermocouples are connected in cascade with furnace thermocouples to insure the heating element always maintain uniform conditions under dynamically changing temperature and load conditions.

The thermocouple includes compression ferrule adapter 150. The compression ferrule adapter 150 is then fitted to male pipe 140 with aluminum bushings 135 and nut 134 holding spring strain relief 136 which is attached to the 6-pin/3-junction connector 138 by wire leads 137. Compression ferrule adapter 150 can then be screwed into mount 107.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. An apparatus for accessing a furnace module in a high temperature furnace, the furnace module containing a heating element, the furnace module having 1) a first end, 2) opposing end, 3) first side, and 4) second side, comprising:

a frame supporting the furnace module, the frame having a first side and a second side coincident with the first side and second side of the furnace module, the frame having a first cantilever member and a second cantilever member extending from the frame second side toward the frame first side;

a first slider coupled to the first cantilever member;

a second slider coupled to the second cantilever member; and means for coupling the first and second sliders to the furnace module such that the furnace module can extend toward the frame first side.

2. In a high temperature diffusion furnace, an apparatus for positioning a heating element, comprising:

a beam coupled to the high temperature diffusion furnace;

a cable extending from the beam;

means, coupled to the cable, for attaching the cable to the heating element; and means, coupled to the cable, for moving the cable allowing the heat element to be positioned.

3. An apparatus for accessing a furnace module in a high temperature horizontal diffusion furnace having 1) a load end, 2) a source end, 3) a first side and 4) a second side, the first side and the second side being substantially perpendicular to the load end and the source end, comprising:

a frame supporting the furnace module; and means, coupled to the frame, for moving the furnace module in a direction from the first side to the second side.

4. The apparatus of claim 3, wherein the frame includes:

a cantilever member, coupled to the frame, extending from the first side toward the second side.

5. The apparatus of claim 4, wherein the means for moving the furnace module includes:

a slider, coupled to the cantilever member and the furnace module, allowing for the furnace module to be extended in a direction from the first side to the second side.

6. The apparatus of claim 3, wherein the furnace module includes a heating element and further includes:

means for transferring the heating element to or from the furnace.

7. The apparatus of claim 6, wherein the means for transferring the heating element includes:

a beam;

a cable extending from the beam;

means, coupled to the cable, for attaching the cable to the heating element; and means, coupled to the cable, for moving the cable allowing the heating element to be transferred to or from the high temperature furnace.

8. The apparatus of claim 7, wherein the means for attaching includes:

an eyelet connector coupled to the cable; and a bulkhead, coupled to the heating element, having an opening.

9. The apparatus of claim 7, wherein the means for moving includes:

a motor.

10. An apparatus for accessing a furnace module including a heating element in a high temperature horizontal furnace having 1) a load end, 2) an opposing end, 3) a front side, and 4) a back side, comprising:

a frame supporting the furnace module;

a cantilever member extending from the high temperature horizontal furnace back side toward the high temperature horizontal furnace front side, supporting the furnace module;

a slider, coupled to the cantilever member and the furnace module allowing for the furnace module to be extended in a direction from the high temperature horizontal furnace back side to the high temperature horizontal furnace front side;

a beam coupled to the high temperature furnace;

a cable extending from the beam;

means, coupled to the cable, for attaching the cable to the furnace module heating element; and means, coupled to the cable, for moving the cable, allowing the heating element to be transferred to and from the high temperature furnace.

11. The apparatus of claim 10, wherein the means for attaching includes:

an eyelet connector coupled to the cable; and a bulkhead, coupled to the heating element, having an opening.

12. The apparatus of claim 10, wherein the means for moving includes:

a motor.

13. A high temperature horizontal diffusion furnace having a first furnace module and a second furnace module for processing a semiconductor wafer, comprising:

a frame; and means, coupled to the frame, for accessing the first furnace module while the second furnace module processes a semiconductor wafer.

14. The furnace of claim 13, wherein the means for accessing includes:

means for laterally moving the first furnace module.

15. The furnace of claim 14, wherein the first furnace module includes a heating element and the means for accessing further includes:

a beam;

a cable extending from the beam;

means, coupled to the cable, for attaching the cable to the heating element; and means, coupled to the cable, for moving the cable allowing the heating element to be transferred to or from the high temperature horizontal diffusion furnace.

16. The furnace of claim 15, wherein the means for attaching includes:

an eyelet connector coupled to the cable; and a bulkhead, coupled to the heating element having an opening.

17. The furnace of claim 15, wherein the means for moving includes:

a motor.

18. A high temperature horizontal diffusion furnace having a first furnace module and a second furnace module for processing a semiconductor wafer, comprising:

a frame; and means, coupled to the frame, for accessing the first furnace module in order to maintain the first furnace module without effecting the ability of the second furnace module to process a semiconductor wafer.

19. The furnace of claim 18, wherein the means for accessing includes:

means for laterally moving the first furnace module substantially perpendicularly to an elongated axis of the first furnace module.

* * * * *